(12) United States Patent
Renau

(10) Patent No.: US 11,217,427 B1
(45) Date of Patent: Jan. 4, 2022

(54) SYSTEM, APPARATUS AND METHOD FOR BUNCHED RIBBON ION BEAM

(71) Applicant: Applied Materials, Inc., Santa Clara, CA (US)

(72) Inventor: Anthony Renau, West Newbury, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/106,016

(22) Filed: Nov. 27, 2020

(51) Int. Cl.
*H01J 37/317* (2006.01)
*H01J 37/304* (2006.01)
*H01J 37/04* (2006.01)
*H01J 37/30* (2006.01)

(52) U.S. Cl.
CPC ........ *H01J 37/3171* (2013.01); *H01J 37/045* (2013.01); *H01J 37/304* (2013.01); *H01J 37/3007* (2013.01); *H01J 2237/1518* (2013.01)

(58) Field of Classification Search
CPC .. H01J 37/3171; H01J 37/045; H01J 37/3007; H01J 37/304; H01J 2237/1518
See application file for complete search history.

(56) References Cited

U.S. PATENT DOCUMENTS

| | | | |
|---|---|---|---|
| 2006/0113493 A1* | 6/2006 | Kabasawa | H01J 27/024 250/492.21 |
| 2009/0206270 A1* | 8/2009 | Glayish | H01J 37/3171 250/396 ML |
| 2010/0065761 A1* | 3/2010 | Graf | H01J 37/3171 250/492.21 |
| 2010/0171042 A1* | 7/2010 | Kellerman | H01J 37/3171 250/396 R |
| 2011/0186748 A1* | 8/2011 | Ruffell | H01L 21/68764 250/400 |
| 2011/0215262 A1* | 9/2011 | Satoh | H01J 37/1472 250/492.21 |
| 2014/0110596 A1* | 4/2014 | Chang | H01J 37/3171 250/396 R |

* cited by examiner

*Primary Examiner* — Sean M Luck
(74) *Attorney, Agent, or Firm* — Kacvinsky Daisak Bluni PLLC

(57) ABSTRACT

An apparatus may include a scanner, arranged to receive an ion beam, and arranged to deliver a scan signal, defined by a scan period, to scan the ion beam between a first beamline side and a second beamline side. The apparatus may include a corrector module, disposed downstream of the scanner, and defining a variable path length for the ion beam, between the first beamline side and the second beamline side, wherein a difference in propagation time between a first ion path along the first beamline side and a second ion path along the second beamline side is equal to the scan period.

19 Claims, 6 Drawing Sheets

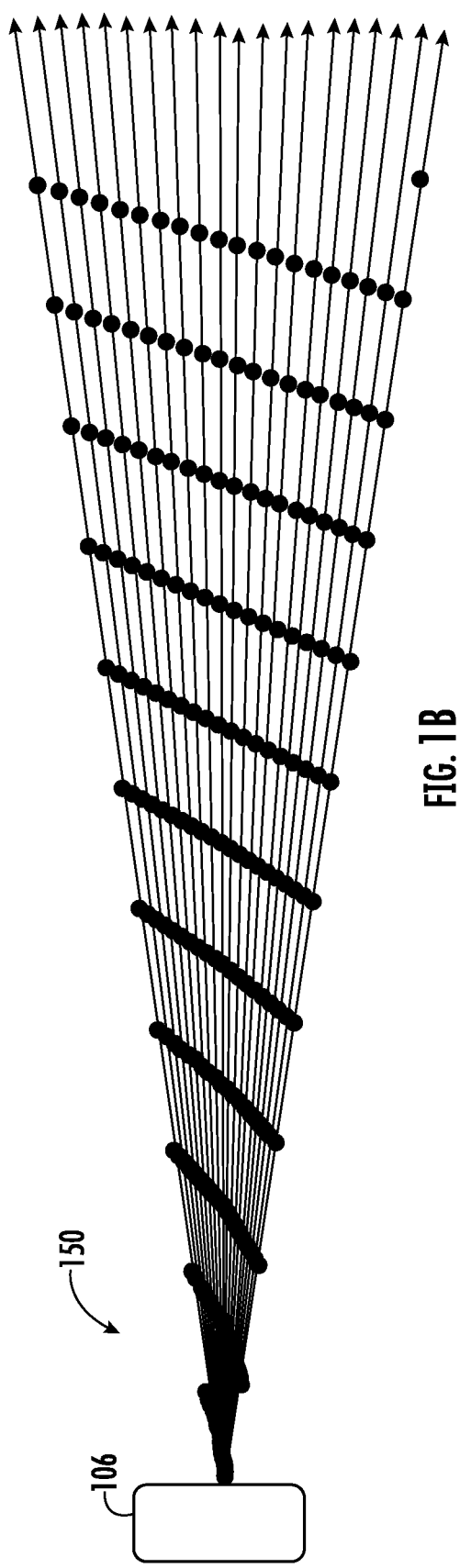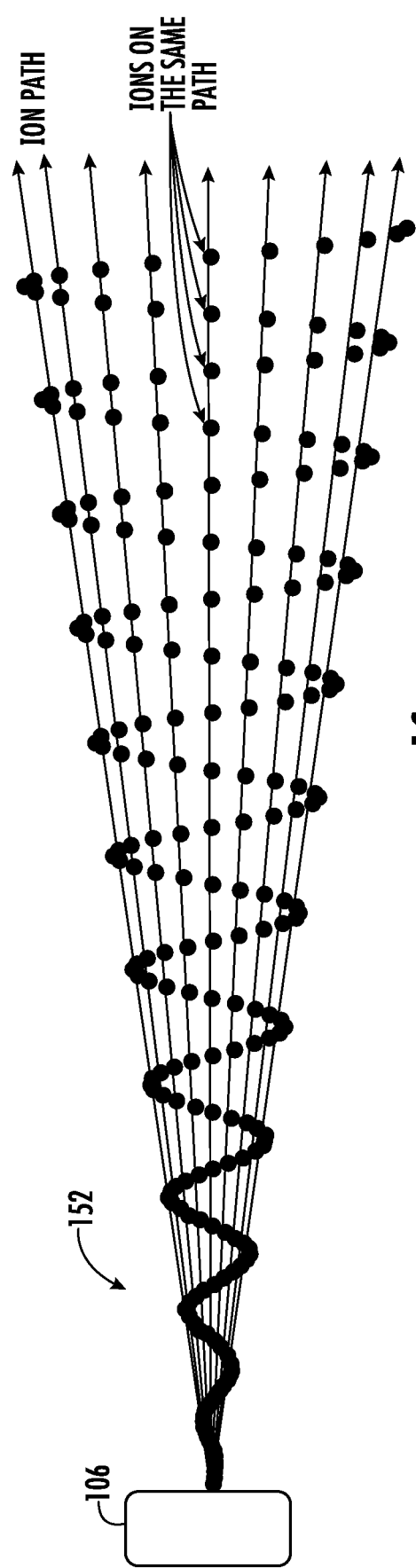

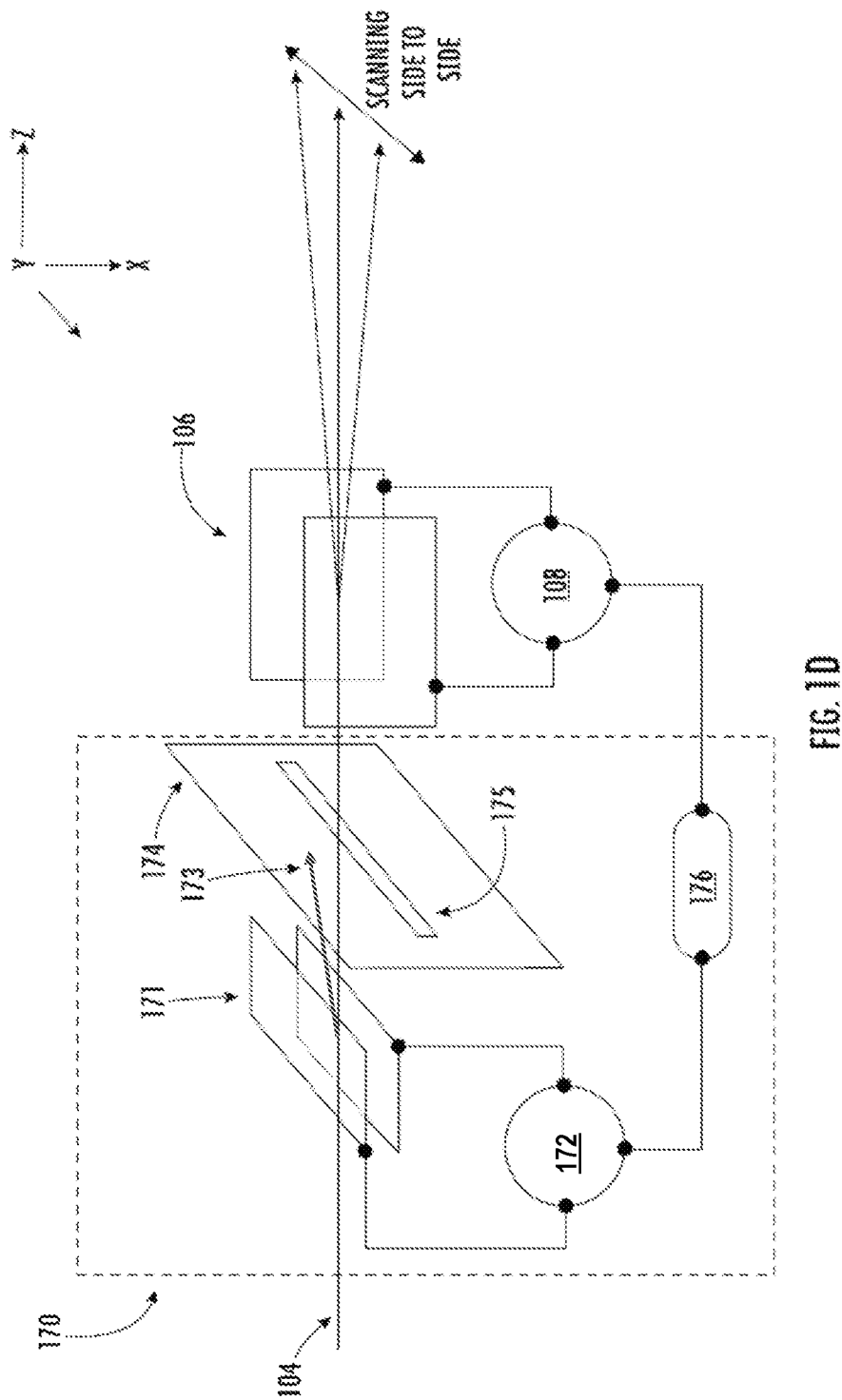

SYSTEM, APPARATUS AND METHOD FOR BUNCHED RIBBON ION BEAM

FIELD OF THE DISCLOSURE

The disclosure relates generally to ion implantation apparatus and more particularly to high energy beamline ion implanters.

BACKGROUND OF THE DISCLOSURE

Ion implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an AC voltage signal. Known (RF) LINACs are driven by an RF voltage applied to one or more AC drift tube electrodes at 13.56 MHz-120 MHz, creating an RF field in an accelerating gap between the AC drift tube electrode and a grounded drift tube electrode that oscillates at the same frequency as the applied RF voltage. Ions arriving when the field is accelerating will increase velocity while ions arriving when the field is decelerating will decrease velocity. Although the average field over time greater than one RF period is zero, the accelerator works to accelerated ions on average because ions entering an acceleration stage are bunched into packets of ions that arrive at an acceleration stage at separate instances in time. In this manner, the arrival time of an ion bunch may be timed so that as many ions as possible arrive whilst the electric field is accelerating. Ideally, ions will arrive when the electric field enables maximum acceleration, in other words, at peak amplitude. However, since the electric field is continually changing and given that the ion bunches enter a given accelerating gap over an interval of non-zero duration, some parts of an ion bunch will be accelerated more than others.

In view of the above, there are three aspects of known LINAC acceleration apparatus. Firstly, the ions need to be bundled or bunched. The ions also need to be accelerated by the drift tube cavities. Finally, since the ions that emerge from a LINAC have not all been accelerated by the same amount, a velocity (or energy filter) may be required to establish a more monoenergetic ion beam.

If an ion beam is to be used for single wafer implantation, then another module may also be needed to produce a parallel ribbon beam. As a consequence, known implantation apparatus employing a LINAC often use four modules.

1) A buncher is deployed upstream and works by breaking a continuous beam into bunches of ions, so that each bunch will arrive at the cavities (drift tube electrodes) having a period given by the cavity frequency (e.g. if the frequency is 13.6 MHz, then ideally bunches should be arriving every 1/13.6 microseconds). This bunching is accomplished by applying ac fields to slow down ions at the leading edge of the bunch and to speed up ions at the trailing edge.

2) An accelerator (LINAC) includes N RF acceleration stages, where each RF acceleration stage includes at least one AC drift tube electrode, driven by a time varying electric field, supplied by a resonator circuit, usually at an RF frequency above 1 MHz. The phase and amplitude of the electric field may be varied in order for the timing of the peak electric field to best coincide with the arrival of the ion bunch at the accelerating gap, adjacent to a given AC drift tube electrode.

3) An energy filter is provided to compensate for the fact that ions will not all emerge from the linear accelerator with a single ion energy. An energy filter is needed to limit the final energy spread in the ion beam. An energy filter may operate by deflecting the beam through a given angle. The required ion beam is transmitted through a (real or virtual) resolving aperture, while the ions of lower or higher energy are over bent or under bent, and are not transmitted. The ions that are transmitted still have an energy spread, but the energy spread is less so than before the filtering. The deflection system may be based upon either magnetic or electrostatic fields. A result of the deflection is that the transmitted ions have not just an energy spread, but also an angle spread induced by the deflection.

4) A scanner may be deployed downstream of the LINAC to generate a ribbon beam that has a wide aspect along one direction, in order to cover a substrate having a given width or diameter. In addition, an angle correction system may be included to focus an ion beam into a parallel ribbon beam that is sized according to the size of a substrate to be implanted, such as >300 mm wide for a 300 mm wide substrate. Because the ion energy of the ion beam may be very high, such as greater than 1 MeV, the size of such components as an angle correction system may be relatively large and costly.

With respect to these and other considerations the present disclosure is provided.

BRIEF SUMMARY

In one embodiment, an apparatus is provided. The apparatus may include a scanner, arranged to receive an ion beam, and arranged to deliver a scan signal, defined by a scan period, in order to scan the ion beam between a first beamline side and a second beamline side. The apparatus may include a corrector module, disposed downstream of the scanner, where the corrector module defines a variable path length for the ion beam, between the first beamline side and the second beamline side. As such, a difference in propagation time between a first ion path along the first beamline side and a second ion path along the second beamline side may be equal to the scan period.

In another embodiment, an ion implanter is provided. The ion implanter may include an ion source, arranged to generate a continuous ion beam, and a lateral buncher, disposed downstream of the ion source, and arranged to output the continuous ion beam as a bunched ion beam. The lateral buncher may include a scanner, arranged to receive an ion beam between a first scan component disposed on a first beamline side and a second scan component disposed on a second beamline side, and deliver a scan signal, defined by a scan period, to the plurality of scan components. The ion implanter may include a corrector module, disposed downstream of the scanner, the corrector module defining a different path length for the ion beam, between the first beamline side and the second beamline side, and a linear accelerator, disposed downstream of the corrector module, to receive the bunched ion beam.

In another embodiment, a method may include receiving an ion beam in a scanner, and scanning the ion beam back and forth within a scan plane at a scan frequency corresponding to a scan period, between a first beamline side and a second beamline side. The method may also include creating a differing path length for the ion beam between a first path along the first beamline side, and a second path along the second beamline side. As such, a bunched ribbon beam may be generated, comprising a plurality of elongated ion bunches, having an elongation direction perpendicular to a direction of propagation of the bunched ribbon beam, and spaced in time according to the scan frequency.

BRIEF DESCRIPTION OF THE DRAWINGS

FIG. 1B illustrates a scenario in accordance with the present embodiments when the scanner 106 uses a sawtooth wave form.

FIG. 1C illustrates the geometry of a scanned ion beam subject to a sinusoidal waveform without other correction;

FIG. 1D depicts an apparatus In accordance with further embodiments of the disclosure;

Figure 1A:
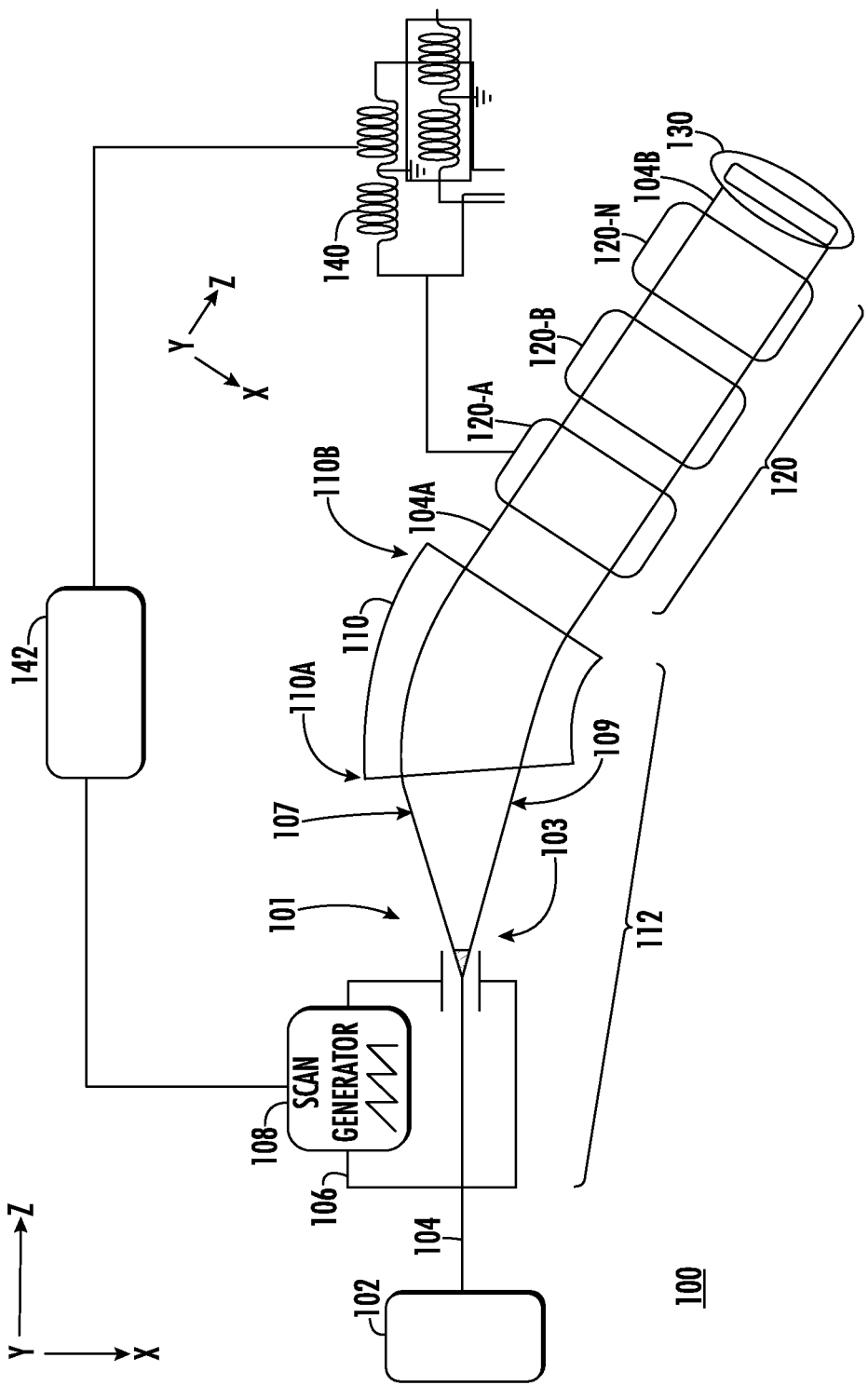
FIG. 1A depicts an ion implanter 100, in accordance with embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that generate bunched ribbon ion beams for processing in a linear accelerator or LINAC.

FIG. 1A depicts an ion implanter 100, in accordance with embodiments of the disclosure. The ion implanter 100 includes an ion source 102, arranged to generate a continuous ion beam, shown as ion beam 104. The ion implanter 100 may include an apparatus, referred to herein as a lateral buncher 112, disposed downstream of the ion source 102, and arranged to output the continuous ion beam as a bunched ion beam 104A. The ion implanter 100 may also include a linear accelerator 120, disposed downstream of the lateral buncher 112, to receive the bunched ion beam 104A. In particular, as detailed with respect to the embodiments to follow, the lateral buncher 112 and other lateral bunchers may act to generate a plurality of ion bunches the define a ribbon ion beam shape, before entering the linear accelerator 120. The linear accelerator 120 may include a series of acceleration stages, shown as acceleration stage 120A, acceleration stage 120B, and any number of additional acceleration stages, shown collectively as acceleration stage 120N. In various non-limiting embodiments, the number of acceleration stages may equal from three to more than one dozen. The linear accelerator 120 may act to accelerate the bunched ion beam 104A from an initial ion energy that may range from several tens of keV to several hundred keV to a final ion energy of 1 MeV, 2 MeV, 5 MeV, 10 MeV, according to different non-limiting embodiments. The linear accelerator 120 may direct a high energy bunched ion beam 104B to a substrate stage 130 as a ribbon beam, as shown in FIG. 1A.

Advantageously, and in accordance with some embodiments of the disclosure, various components that are normally placed downstream of a linear accelerator in known LINAC type ion implanters may be omitted from the ion implanter 100. These apparatuses include energy filters, correctors, and scanners, for example. As such, the ion implanter 100 may be constructed with various relatively larger components omitted.

As illustrated in FIG. 1A, the lateral buncher 112 may include a scanner 106, arranged to receive the ion beam 104 between a first scan component 106A, disposed on a first beamline side 101 and a second scan component disposed on a second beamline side 103. As shown in FIG. 1A, the scanner 106 may include a signal generator 108, to deliver a scan signal, defined by a scan period, to the scan components of the scanner 106. According to various embodiments, the scanner 106 may be an electrostatic scanner or an electro-magnetic scanner. However, the scanner usually runs at high frequencies, which high frequency makes electromagnetic scanning very difficult.

The lateral buncher 112 may further include a corrector module 110, disposed downstream of the scanner 106, where the corrector module defines a variable path length for the ion beam 104, between the first beamline side 101 and the second beamline side 103. As such, the path length difference between a first ion path 107, along the first beamline side 101 and a second ion path 109, along the second beamline side 103 may be arranged to bunch ions of the ion beam 104 in a manner that causes the bunched ion beam 104A to arrive at the linear accelerator 120 as a series of bunches having an elongated cross section, elongated along the X-axis of the Cartesian coordinate system shown, where in a given bunch, the ions of the bunched ion beam 104A arrive at the same time at an X-Y plane at the entrance to the linear accelerator 120. Moreover, the trajectories of the ions of the bunched ion beam 104A may be parallel to one another and aligned along the Z-axis. To accomplish this feature, the difference in path length between the first ion path 107 and second ion path 109 may be set equal to the product of the scan period of the scan signal and the velocity (such as the average velocity) of ions of the ion beam 104.

As in known linear accelerators, the acceleration stages of the linear accelerator 120 may be driven by high frequency signals to accelerate the ion beam 104 to a final targeted energy. Examples of appropriate acceleration frequency to drive the acceleration stages include frequencies between 13.56 MHz and 40 MHz in various non-limiting embodiments. In order to synchronize the arrival of ribbon beam-shaped bunches of ions of bunched ion beam 104A with the acceleration stages of the linear accelerator, the scan frequency of the scanner 106 may be set to correspond to an integer fraction of the acceleration frequency applied to acceleration stages 120A . . . 120N. This arrangement will allow a given bunch of the bunched ion beam 104A to always arrive at the peak of acceleration voltage applied at the acceleration stage 120A, for example. As an example, the beam will be accelerated if the buncher frequency is half the frequency of the accelerator, although every other accelerating wave will be empty.

As an example where the scanner 106 is an electrostatic scanner, the signal generator may apply an RF voltage signal as a periodic waveform at 13.56 MHz between two opposing scan plates in one case. One suitable waveform according to an embodiment of the disclosure is a sawtooth waveform where the scan voltage changes linearly with time during a scan period between a first value and a second value, and resets instantaneously to the first value at the end of the scan period.

In the arrangement of FIG. 1A, and in accordance with various embodiments of the disclosure, the flight time of an ion travelling around the corrector module 110 may be set to vary in a way similar to the waveform applied by the scanner 106. For example, if the scanner voltage has a saw tooth waveform, with a linearly varying voltage over time, then the flight time of different ions traversing different ion paths through the corrector module 110 needs to vary linearly from the first beamline side 101 to the second beamline side 103. To accomplish this feature of changing the time of flight of various ions, the geometry of the corrector module may be arranged as follows. In the embodiment of FIG. 1A, the corrector module 110 may define a ribbon beam shape on an entrance end 110A and on an exit end 110B of the corrector module 110. In other words, the chamber of the corrector module 110 may be elongated along the X-axis to conduct a ribbon shape beam, such as 20 cm, 30 cm, or more, where the beam height along the Y-axis may be several cm or less in various non-limiting embodiments. In addition, as shown in FIG. 1A, the corrector module 110 may have a curved chamber shape, where the principle direction of propagation of the ion beam (represented by the Z-axis) changes from the entrance end 110A to the exit end 110B. Ions traveling closer to the second beamline side 103 will traverse a shorter arc through the corrector module 110 than ions traveling closer to the first beamline side 101, leading to an increased time of flight of ions traveling along the first ion path 107, for example.

Thus, when the corrector module 110 is arranged as shown, when the increased flight time corresponds to an increased pathlength from the second beamline side 103 to the first beamline side 101, then the scan of scanner 106 would need to start on the outside (first beamline side 101), and the scan period would need to correspond to an integer fraction of the accelerator frequency. As noted above, the path length difference between the first ion path 107 along the first beamline side 101 and the second ion path 109 along the second beamline side could be set equal to a product of the scan period and the velocity of the ion beam 104, when entering the scanner 106. For a scan frequency of 13.6 MHz, and a 200 keV Phosphorus ion beam, then a pathlength difference of approximately 8 cm for ions traveling along the first ion path 107 and the second ion path 109 could be used to ensure that ions traversing the corrector module 110 within a given scan period arrive at the linear accelerator at the same time across the entire width (along the X-axis) of the bunched ion beam 104A.

According to embodiments of the disclosure, the corrector module 110 may be implemented using a bending magnet. If so, the bending magnet may be substantially smaller than those used in conjunction with known LINAC ion implanters, because the ion beam 104 is being bent by the corrector module 110, upstream of the linear accelerator 120, and therefore at a much lower ion energy, as compared with known designs having a corrector positioned downstream of the linear accelerator. In some embodiments, the corrector magnet may be as small as 20% or 25% of the size of corrector magnets used in known LINAC accelerator configurations.

FIG. 1B illustrates a scenario in accordance with the present embodiments when the scanner 106 uses a sawtooth wave form. The ions are shown as dots while the trajectories of different ions are shown as arrows. Ions propagate from the scanner 106 as bunches 150 that are linearly inclined to the (z) axis of propagation. To generate an elongated beam that is bunched along a direction perpendicularly to the propagation axis (z-axis) the corrector module 110 may be arranged in a manner to linearly increase the flight time of the ions from the first beamline side 101 to the second beamline side 103.

In other embodiments, the scanner 106 may be driven by a sinusoidal waveform output by the scan generator 108. An advantage of using a sinusoidal waveform to scan an ion beam as part of a ribbon beam buncher is that sinewave power supplies capable of operating at frequencies comparable to the RF frequencies of a LINAC are more readily available. Note that in these embodiments, the generation of a laterally bunched ribbon beam using a sinusoidal scan waveform may entail different components for a lateral buncher. FIG. 1C illustrates the geometry of a scanned ion beam subject to a sinusoidal waveform without other correction. As shown in FIG. 1C, when the scanner is driven by a sinusoidal wave form, then the ions will propagate from the scanner bunched as a sine wave 152 about the z axis. This beam geometry requires a modified corrector system in order to produce a beam that is bunched perpendicular to the propagation axis on exit.

In accordance with further embodiments of the disclosure, FIG. 1D depicts an apparatus 160 suitable for of correcting a beam that is scanned by a sinusoidal scan wave form. The scanner 106 and scan generator 108 may operate generally as previously described. Again, the scan generator 108 in this apparatus may be capable of generating a sinusoidal waveform as an ion beam traverses through the scanner 106. Without modification, the ion beam 104 would assume the sinusoidal geometry generally as shown in FIG. 1C. To modify the shape of the ion beam output by the scan generator 108, the apparatus 160 provides a blanking system 170, which system is shown upstream of the scanner 106. The blanking system 170 includes a pair of electrodes, termed blanking electrodes 171, and a blanking target 174, provided with a narrow slot, termed a transmission slot 175. The transmission slot 175 acts as a blanking aperture for transmitting the ion beam 104 when the transmission slot 174 is aligned with the ion beam 104.

The blanking electrodes 171 may be arranged in a symmetric fashion about the z-axis, and displaced from one another along the X-axis, to be disposed on opposite sides of a beam position for ion beam 104. At the same time the blanking electrodes 171 are arranged perpendicular to the scan plates of scanner 106, as shown. In operation, when the scan plates of the scanner 106 are scanning the ion beam 104 from side to side along the Y-axis, the blanking electrodes 171 may move the ion beam 104 up and down along the x-axis, when a voltage is applied to the blanking electrodes 171. In the orientation shown in FIG. 1D, the transmission slot 175 in the blanking target is arranged horizontally, along the Y-axis. When the net voltage between the blanking electrodes 171 is zero, no electric field will be present in the gap between the blanking electrodes where the ion beam 104 traverses. The ion beam 104 is therefore not deflected by the blanking electrodes 171 and may traverse through the transmission slot 175 and into the scanner 106.

FIG. 1D also illustrates a scenario when a non-zero blanking voltage is applied to the blanking electrodes 171, so that the ion beam 104 is deflected upwardly along the X-axis, shown as the deflected beam 173. In this scenario, the ion beam 104 is intercepted by the solid part of the blanking target 174 and is not transmitted on through to the scanner 106. Likewise, when an opposite non-zero voltage is applied between the blanking electrodes 171, the ion beam 104 may be deflected downwardly along the x-axis in a manner where the ion beam 104 is also intercepted by the blanking target and not transmitted on through to the scanner 106. In the apparatus 160, a blanking voltage is supplied by a blanking signal generator 172 at the blanking frequency that is the same as the frequency of scanning the ion beam applied by the scan generator 108, or at half the frequency of the scan generator 108, according to different embodiments of the disclosure. The apparatus 160 further includes a blanking controller 176, arranged to control the phase and amplitude of the blanking signal applied to the blanking electrodes 171.

Figure 1E:
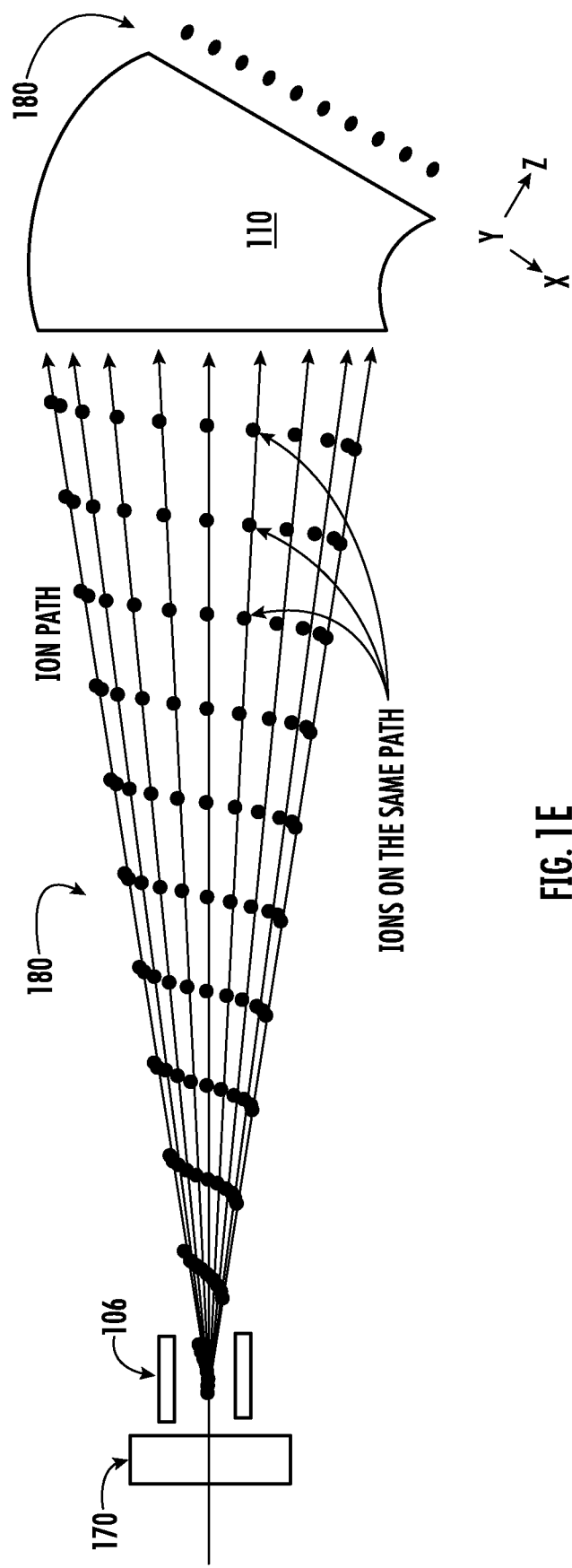
FIG. 1E shows an example of a scanned ion beam, arranged in accordance with embodiments of the disclosure.

FIG. 1E shows an example of a scanned ion beam 180, arranged in accordance with embodiments of the disclosure. In this example, the scanned ion beam may be generated by the apparatus 160, where the scan voltage applied to the scanner 106 varies sinusoidally, while the blanking electrodes 171 semi-blank the scanned ion beam 180 using a blanking frequency that is the same as the scan frequency of the scanner 106. In this scenario, the scanned ion beam 180 is blanked by the blanking electrodes 171 half the time. For example, the blanking voltage applied to the blanking electrodes may be mono polar, where one of blanking electrodes 171 (plate) is grounded while the other of the blanking electrodes receives a periodic blanking voltage. The periodic blanking voltage is generated at the same frequency as the sinusoidal scanner voltage, but has a different phase and amplitude, so that once every cycle the scanned ion beam 180 is deflected (upwards, in the example of FIG. 1D) enough for the scanned ion beam 180 to no longer be transmitted through the transmission slot. The phase and amplitude of the blanking voltage are tuned so that just approximately half of the sinusoid is transmitted through to the corrector module 110, resulting in the discrete bunches of ions of scanned ion beam 180, as is shown in FIG. 1E (compare to FIG. 1C). Note that to correct the sinusoid shape of the bunches of the scanned ion beam 180, the corrector module 110 may be appropriately shaped to generate a varying time of flight from first beamline side 101 to second beamline side 103 that matches the shape of the sinusoidal shape of the scanned ion beam 180. Thus, the scanned ion beam 180 may emerge as a laterally bunched ion beam having an elongated axis extending perpendicularly to the propagation direction, as shown.

Alternatively, in other embodiments, the blanking signal generator 172 may generate a bipolar voltage signal, so that the ion beam 104 moves both up and down along the X axis as the bipolar voltage signal is applied. In that case the signal may be applied at half the frequency of the scanning signal output by scan generator 108, because, as the ion beam 104 moves up and back down again, the ion beam 104 passes through the transmission slot 175 twice during each blanking cycle. Again, the phase and amplitude of the blanking signal may be tuned so that just approximately half of the sinusoid ion beam is transmitted through to the corrector, as is shown in FIG. 1E.

As shown in FIG. 1A, once entering the linear accelerator 120 as a bunched ribbon beam, the bunched ion beam 104A may be accelerated through the various acceleration stages of the linear accelerator 120 to increase the overall energy of the bunched ion beam 104A. Because the bunched ion beam 104A may have a ribbon beam shape, the various drift tube electrodes of the acceleration stages may be elongated along the X-axis to accommodate such a shape, such as having an X-axis dimension of 30 cm or more, while having a Y-axis dimension that is much smaller, such as several centimeters. Since the bunches of the bunched ion beam 104A are much better defined temporally by virtue of the aforementioned lateral bunching, in comparison to known bunched ion beams, tuning of the components of the linear accelerator 120 may be more straightforward. Moreover, in the embodiment of FIG. 1A, an energy filter, located downstream of the linear accelerator in known designs, may be omitted due to the more monoenergetic nature of the bunched ion beam 104A.

As shown in FIG. 1A, the stages of the linear accelerator 120 may be driven by an RF power source, shown as RF power source 140, where the different stages may be individually driven by dedicated RF power sources (not separately shown) in various embodiments. A given power source will apply an RF signal to a given accelerator stage at a given RF frequency. To optimize acceleration of a bunched ribbon beam, the scan signal applied by the scanner 106 may be synchronized with the RF signal applied by the RF power source 140. For example, a controller 142 may be provided to synchronize the scan signal and RF signal applied to the accelerator stage 120A, where the scan signal frequency represents an integer fraction of the RF signal applied to the accelerator stage 120A. This synchronization may ensure that a given bunch or the bunched ion beam 104A arrives at the proper instance corresponding to a peak in amplitude of an RF signal applied to an accelerating drift tube electrode of the accelerator stage 120A, for example.

Figure 2:
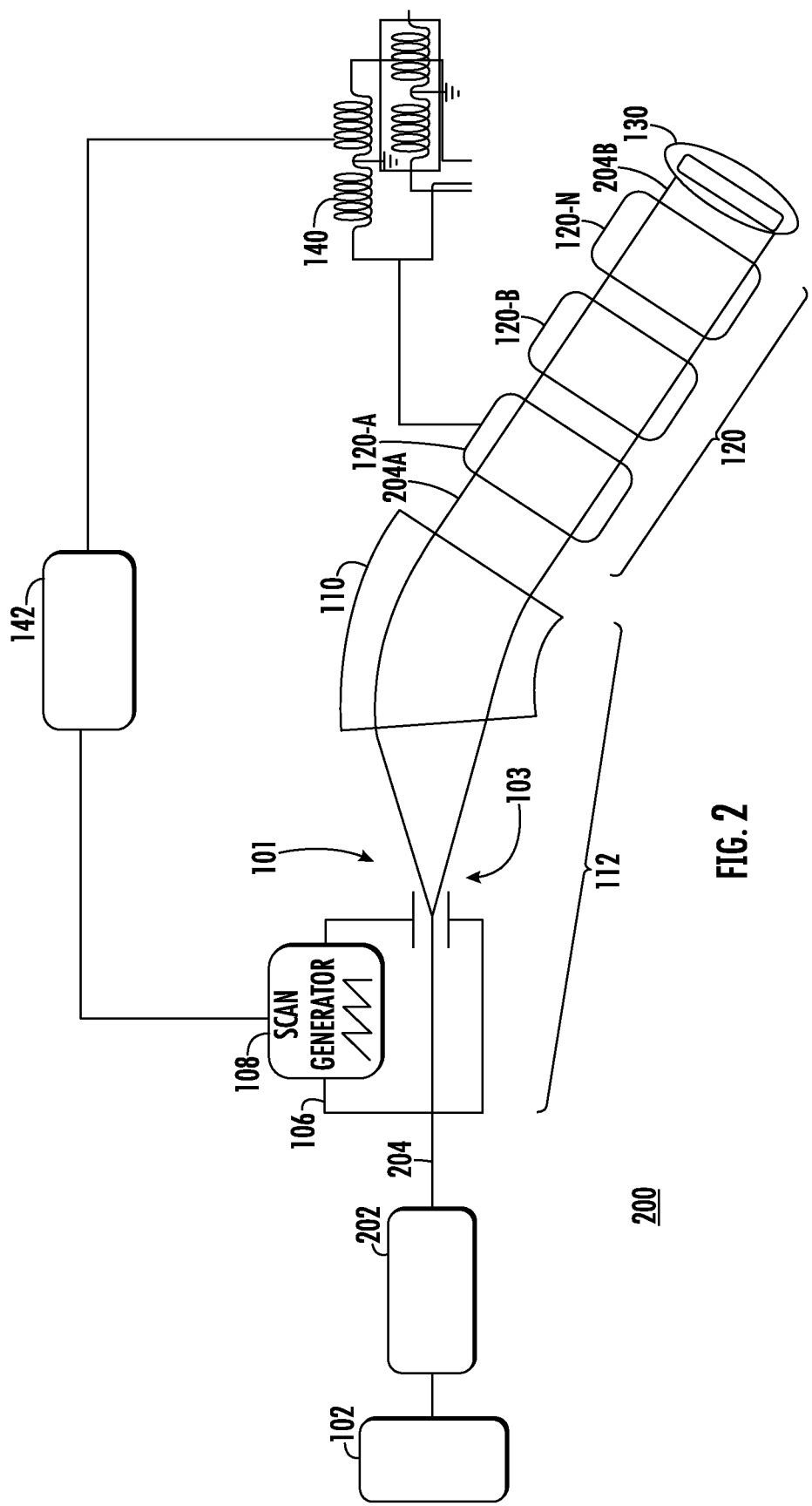
FIG. 2 shows another exemplary ion implanter, according to embodiments of the disclosure.

FIG. 2 depicts an ion implanter 200, in accordance with embodiments of the disclosure. The ion implanter 200 may be arranged similarly to ion implanter 100, where like components are labeled the same. In addition, the ion implanter 200 may include a beam line module 202, to mass analyze and accelerate an ion beam 204 generated by the ion source 102 to a suitable species purity and energy, such as 100 keV, 200 keV, or 500 keV, according to different non-limiting embodiments, before entering the lateral buncher 112, and exiting as bunched ion beam 204A, and exiting linear accelerator 120 as high energy ion beam 204B. An advantage of providing a relatively higher ion energy to the bunched ion beam 204A before entering a linear accelerator is the ability to generate an ion beam with lower space charge forces and less angular spread.

Figure 3:
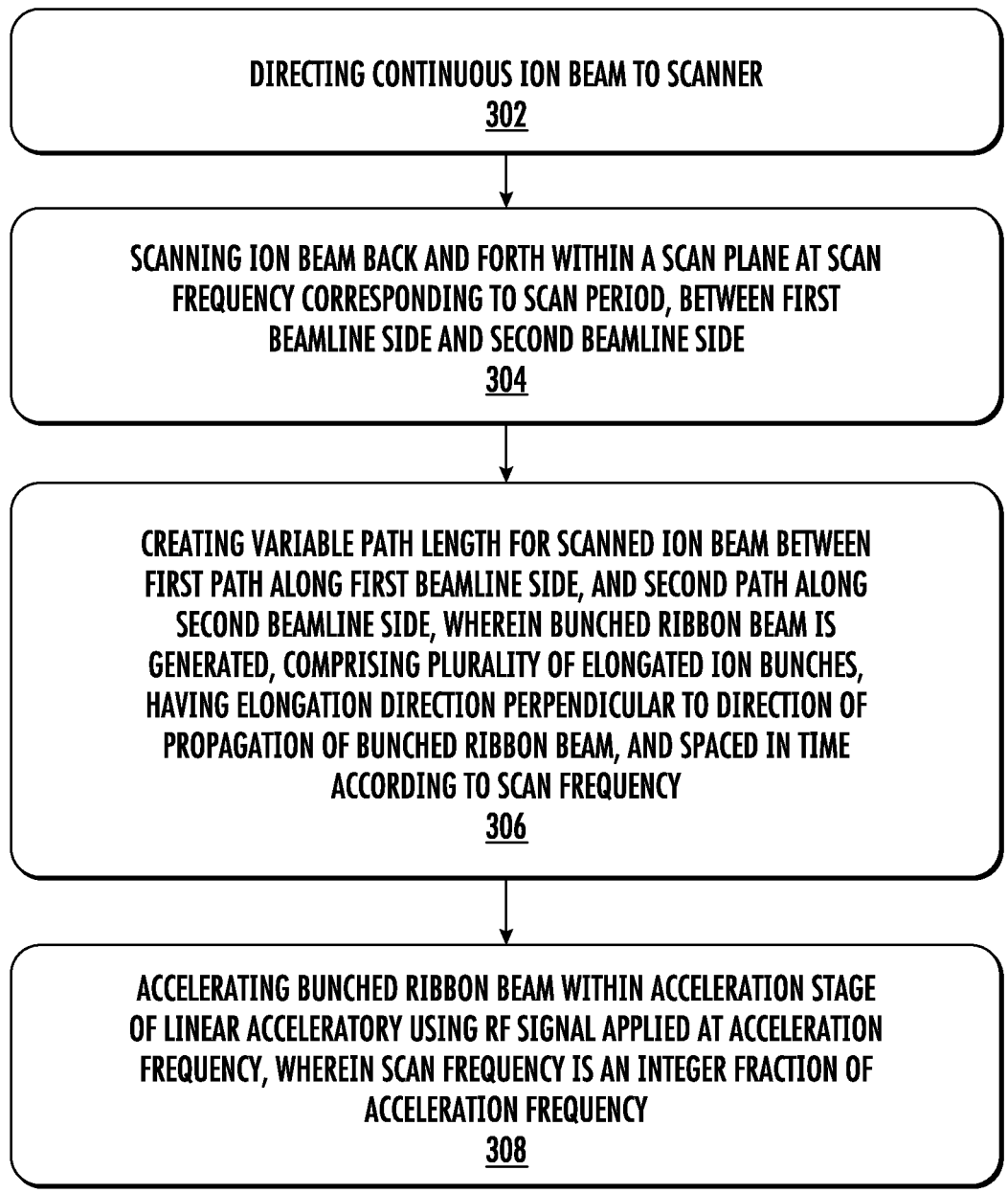
FIG. 3 presents an exemplary process flow.

FIG. 3 depicts an exemplary process flow 300. At block 302, a continuous ion beam is directed to a scanner. The continuous ion beam may be generated at a predetermined ion energy such as 10 keV, 50 keV, 100 keV, 250 keV, or 500 keV in various non-limiting embodiments.

At block 304 the operation is performed of scanning the continuous ion beam back and forth within a scan plane at a scan frequency corresponding to a scan period, between a first beamline side and a second beamline side. As an example, the scanner may include a pair of opposing scan plates that are coupled to an RF voltage signal, creating a varying electric field between the scan plates at the given scan frequency, corresponding to the RF frequency of the RF voltage signal.

At block 306, the operation is performed of creating a variable path length for the scanned ion beam between a first path along the first beamline side, and a second path along the second beamline side. For example, a corrector module may receive the scanned ion beam as a ribbon beam shape, where the corrector module bends the scanned ion beam along an arc, creating different path lengths between ion trajectories or paths along an outside of the arc (first beamline side) and an inside of the arc (second beamline side). Suitable components for such a curved corrector module include a bending magnet, for example. As such, during a given scan period, the scan signal may be applied to the scanner in a manner where the scanned ions may arrive at the entrance to the curved corrector module, firstly at the outside of the arc, and lastly at the inside or the arc. By directing the lagging ions to the inside of the arc, the lagging ions will traverse a relatively shorter path length than the leading ions on the outside of the arc, before emerging form the curved corrector module. By purposeful arrangement of the application of the scan signal to the continuous ion beam entering the scanner, together with the geometry of the corrector module, the ions emerging from the corrector module across the width of the corrector module may generate a bunched ribbon beam. In particular, the bunched ribbon beam will be characterized by a plurality of elongated bunches that are elongated in a direction perpendicular to the direction of propagation of the bunched ribbon beam, in other words, elongated across the exit end of the corrector module from the inside arc to the outside arc. Within a given bunch, the ions will exit the corrector module with mutually parallel trajectories along a principal direction of propagation and will intercept a given plane that is perpendicular to the principle direction of propagation at the same time. The bunched ribbon beam will also be characterized by a spacing in time between successive bunches that is spaced according to scan the frequency, meaning spaced one scan period apart.

At block 308 the bunched ribbon beam is accelerated within an acceleration stage of a linear acceleratory using an RF signal applied at an acceleration frequency, where the scan frequency is an integer fraction of the acceleration frequency. The acceleration RF signal may also be synchronized with the scan signal so that a given bunch of the bunched ribbon beam always arrives at the same relative phase of the acceleration RF signal, such as at the peak amplitude of the acceleration RF signal.

In view of the foregoing, at least the following advantages are achieved by the embodiments disclosed herein. A first advantage is the ability to construct a high energy ion implanter while avoiding expensive downstream components for handling high energy ion beams emerging from a LINAC, such as corrector magnets. Another advantage is the ability to avoid inefficient bunching of known LINACs, where the majority of ions of the original ion beam are lost because the ions cannot be efficiently bunched through the stages of the linear accelerator. A further advantage of the present embodiments is that the ions are not bunched in a manner that contributes to energy spread of the ion beam, as in known LINACs. A further advantage is that with less energy spread tuning of a LINAC becomes less complex using a laterally bunched ion beam according to the present embodiments. Yet a further advantage is that the present embodiments avoid undue angulator spread that may take place in known LINAC ion implanters, where ions entering an energy filter have a spread in energies, resulting in a spread of angles in the transmitted beam. Moreover, the present embodiment avoid the further angular spread that may be introduced by downstream angled correctors, where an energy spread will be translated into an angular spread in the ion beam.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
a scanner, arranged to receive an ion beam, and arranged to deliver a scan signal, defined by a scan period, to scan the ion beam between a first beamline side and a second beamline side; and
a corrector module, disposed downstream of the scanner, the corrector module defining a variable path length for the ion beam, between the first beamline side and the second beamline side, wherein a difference in propagation time between a first ion path along the first beamline side and a second ion path along the second beamline side is equal to the scan period.

2. The apparatus of claim 1, wherein the difference in propagation time is due to a pathlength difference between the first beamline side and the second beamline side, equal to a product of the scan period and an average velocity of the beam within the corrector module.

3. The apparatus of claim 1, wherein the scan period corresponds to a scan frequency above 1 MHz.

4. The apparatus of claim 1, wherein the scanner comprises an electrostatic scanner.

5. The apparatus of claim 1, wherein the corrector module defines a ribbon beam shape on an entrance end and on an exit end of the corrector module, and wherein the exit end defines a parallel beam geometry.

6. The apparatus of claim 5, wherein the corrector module comprises a curved chamber.

7. The apparatus of claim 1, wherein the scan signal comprises a sawtooth waveform.

8. The apparatus of claim 1, further comprising a blanking system, disposed upstream of the corrector module, the blanking system comprising a set of blanking electrodes and a blanking target, disposed downstream of the set of blanking electrodes, the blanking target comprising a blanking aperture for transmitting the ion beam.

9. The apparatus of claim 8, the blanking system comprising a blanking signal generator arranged to send a blanking signal to the set of blanking electrodes at a blanking frequency, equal to a scan frequency of the scan signal, or equal to half the scan frequency of the scan signal.

10. An ion implanter, comprising:
an ion source, arranged to generate a continuous ion beam;

a lateral buncher, disposed downstream of the ion source, and arranged to output the continuous ion beam as a bunched ion beam, the lateral buncher comprising:
- a scanner, arranged to receive an ion beam between a first scan component disposed on a first beamline side and a second scan component disposed on a second beamline side, and deliver a scan signal, defined by a scan period, to the first scan component and the second scan component; and
- a corrector module, disposed downstream of the scanner, the corrector module defining a different path length for the ion beam, between the first beamline side and the second beamline side; and a linear accelerator, disposed downstream of the corrector module, to receive the bunched ion beam.

11. The ion implanter of claim 10, the scan period corresponding to a scan frequency above 1 MHz, wherein the linear accelerator comprises a plurality of RF acceleration stages, defined by an acceleration frequency, wherein the scan frequency is an integer fraction of the acceleration frequency.

12. The ion implanter of claim 10, wherein a path length difference between a first ion path along the first beamline side and a second ion path along a second beamline side is equal to a product of the scan period and a velocity of the ion beam.

13. The ion implanter of claim 10, wherein the corrector module is arranged to produce a parallel ribbon beam.

14. The ion implanter of claim 10, further comprising a blanking system, disposed upstream of the corrector module, the blanking system comprising a set of blanking electrodes and a blanking target, disposed downstream of the set of blanking electrodes, the blanking target comprising a blanking aperture for transmitting the ion beam.

15. The ion implanter of claim 14, the blanking system comprising a blanking signal generator arranged to send a blanking signal to the set of blanking electrodes at a blanking frequency, equal to a scan frequency of the scan signal or equal to half the scan frequency of the scan signal.

16. A method, comprising:
receiving an ion beam in a scanner;
scanning the ion beam back and forth within a scan plane at a scan frequency corresponding to a scan period, between a first beamline side and a second beamline side; and
creating a differing path length for the ion beam between a first path along the first beamline side, and a second path along the second beamline side,
wherein a bunched ribbon beam is generated, comprising a plurality of elongated ion bunches, having an elongation direction perpendicular to a direction of propagation of the bunched ribbon beam, and spaced in time according to the scan frequency.

17. The method of claim 16, wherein a scanner generates a sinusoidal waveform to perform the scanning the ion beam, the method further comprising:
selectively transmitting the ion beam through a blanking system, the blanking system arranged to intercept the ion beam at a blanking frequency equal to one half or one times the scan frequency of the scanner, wherein a portion of the ion beam is intercepted during each scan period.

18. The method of claim 16, wherein the scan frequency is above 1 MHz.

19. The method of claim 16, wherein a scanner generates a sawtooth waveform to perform the scanning the ion beam.

* * * * *